United States Patent
Keum et al.

(10) Patent No.: US 7,329,585 B2
(45) Date of Patent: Feb. 12, 2008

(54) METHOD OF MANUFACTURING SEMICONDUCTOR DEVICE

(75) Inventors: So Hyen Keum, Chungcheongbuk-do (KR); Chan Soo Shin, Daejeon-si (KR)

(73) Assignee: Magnachip Semiconductor, Ltd., Chungchongbuk-do (KR)

( * ) Notice: Subject to any disclaimer, the term of this patent is extended or adjusted under 35 U.S.C. 154(b) by 351 days.

(21) Appl. No.: 11/132,857

(22) Filed: May 19, 2005

(65) Prior Publication Data

US 2005/0260822 A1    Nov. 24, 2005

(30) Foreign Application Priority Data

May 20, 2004    (KR)    ............ 10-2004-0036110

(51) Int. Cl.
*H01L 21/782*    (2006.01)
(52) U.S. Cl. ............................. 438/381; 438/382
(58) Field of Classification Search ............ 438/381, 438/382
See application file for complete search history.

(56) References Cited

U.S. PATENT DOCUMENTS

2005/0272216 A1* 12/2005 Remmel et al. ............ 438/381
2006/0145296 A1*  7/2006 Coolbaugh et al. ......... 257/536

* cited by examiner

*Primary Examiner*—Zandra V. Smith
*Assistant Examiner*—Pamela E Perkins
(74) *Attorney, Agent, or Firm*—Marshall, Gerstein & Borun LLP

(57) ABSTRACT

Disclosed herein is a method of manufacturing a semiconductor device, and more specifically, to a method of manufacturing a semiconductor device having a capacitor and a resistor in which a thin film resistor and a capacitor are formed at the same time, a thin film resistor is formed on a metal wiring, and the two thin film resistors are then serially connected. Accordingly, resistance per unit area in substrate can be increased, a device characteristic can be improved and a process unit price can be lowered.

4 Claims, 2 Drawing Sheets

METHOD OF MANUFACTURING SEMICONDUCTOR DEVICE

BACKGROUND

1. Field of the Invention

The present invention relates to a method of manufacturing a semiconductor device, and more specifically, to a method of manufacturing a semiconductor device having a capacitor and a resistor in which a thin film resistor and a capacitor are formed at the same time, a thin film resistor is formed on a metal wiring, and the two thin film resistors are then serially connected, whereby resistance per unit area in substrate can be increased.

2. Discussion of Related Art

Recently, as the applicability of a device operating in a radio frequency (RF) region of GHz, there is a need for improvements in a device characteristic in the RF region and the analog performance of a passive element. System level integration of wireless application is also required. In view of this, there is a need for high performance and high integration level for a resistor and a capacitor, which are not being used.

In a prior art, resistors are formed in one layer and several resistors are serially connected in order to increase resistance. In this case, however, there is a disadvantage in that an area occupied by the resistors is increased.

SUMMARY OF THE INVENTION

Accordingly, the present invention has been made in view of the above problems, and it is an object of the present invention to provide a method of manufacturing a semiconductor device having a capacitor and a resistor in which a thin film resistor and a capacitor are formed at the same time, a thin film resistor is formed on a metal wiring, and the two thin film resistors are then serially connected, whereby resistance per unit area in substrate can be increased.

To achieve the above object, according to the present invention, there is provided a method of manufacturing a semiconductor device, comprising the steps of: simultaneously forming a capacitor and a first resistor on a semiconductor substrate, forming a first interlayer insulating film on the semiconductor substrate in which the capacitor and the first resistor are formed, forming a plurality of first via plugs that are electrically connected to the capacitor and the resistor, and a first metal wiring that is electrically connected to the first via plugs, in the first interlayer insulating film, forming a second resistor on the first metal wiring, and forming a second interlayer insulating film on the semiconductor substrate in which the second resistor is formed, and then forming a plurality of second via plugs that are electrically connected to the first metal wiring and the second resistor, and a second metal wiring that is electrically connected to the second via plug.

DETAILED DESCRIPTION OF PREFERRED EMBODIMENTS

Figure 1:
FIGS. 1 to 5 are cross-sectional view showing process steps for embodying a method of manufacturing a semiconductor device according to a preferred embodiment of the present invention.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in case where it is described that one film is "on" the other film or a semiconductor substrate, the one film may directly contact the other film or the semiconductor substrate. Or, a third film may be intervened between the one film and the other film or the semiconductor substrate. Like reference numerals are used to identify the same or similar parts.

FIGS. 1 to 5 are cross-sectional view showing process steps for embodying a method of manufacturing a semiconductor device according to a preferred embodiment of the present invention.

Referring to FIG. 1, films for forming a capacitor and a resistor are deposited on a semiconductor substrate 100 in which a given base layer is formed. In other words, a metal film 102, a barrier film 104, a dielectric film 106, a conductive material film 108 and an etch-stop layer 110 are sequentially deposited. In more detail, an aluminum film (Al) 102 being the metal film, a titanium nitride film (TiN) 104 being the barrier film, a silicon nitride film (Si3N4) 106 being the dielectric film, the tantalum nitride film (TaN) 108 being the conductive material film, and a silicon nitride film (Si3N4) 110 being the etch-stop layer are sequentially deposited on the semiconductor substrate 100.

In the above, the aluminum film 102 serves as a lower electrode of a capacitor. The titanium nitride film 104 serves as a barrier film for protecting the underlying aluminum film and as a lower electrode. The silicon nitride film 106 formed on the titanium nitride film 104 serves as dielectric of the capacitor. The tantalum nitride film 108 serves as an upper electrode of the capacitor and also as the resistor. The silicon nitride film 110 formed on the tantalum nitride film 108 serves as an etch-stop layer for protecting the underlying layers in an etch process for forming a via.

Figure 2:
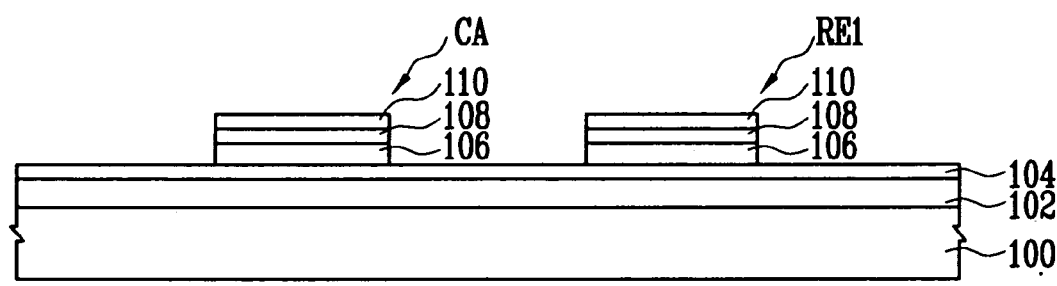

Referring to FIG. 2, a photolithography process and an etch process are performed to form a capacitor CA pattern and a first resistor pattern RE1. That is, the silicon nitride film 110, the tantalum nitride film 108 and the silicon nitride film 106 are selectively patterned to form the capacitor CA pattern and the first resistor pattern RE1.

Figure 3:
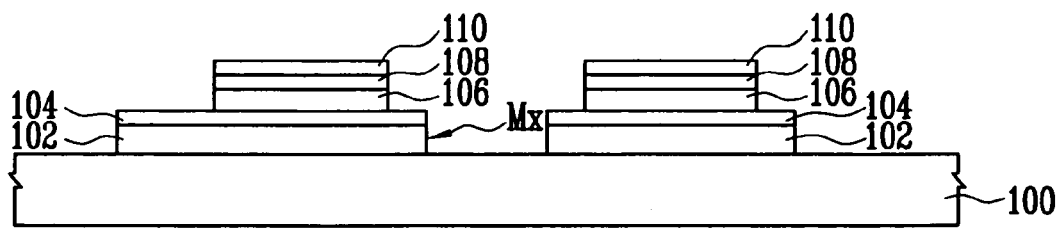

Referring to FIG. 3, the titanium nitride film 104 and the aluminum film 102 are selectively patterned by means of a photolithography process and an etch process, thereby forming a first metal wiring Mx.

Figure 4:
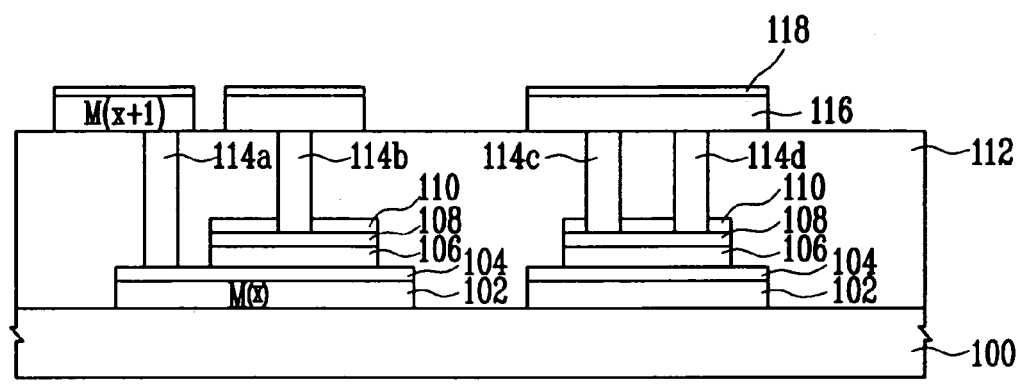

Referring to FIG. 4, a first interlayer insulating film 112 is formed on the semiconductor substrate in which the capacitor and the resistor are formed.

Thereafter, a plurality of first via holes are formed so that the upper electrode of the capacitor, the lower electrode of the capacitor, and the resistor are partially etched.

Then, after a metal material (for example, tungsten (W)) is deposited on the semiconductor substrate in which the first via holes are formed, a chemical mechanical polishing (CMP) or etch-back process is performed to form a plurality of first via plugs 114a, 114b, 114c and 114d which bury the first via holes. The first via plugs 114a is electrically connected to the titanium nitride film 104 of the capacitor.

The first via plugs 114b is electrically connected to the tantalum nitride film 108 of the capacitor. The first via plugs 114c and 114d are electrically connected to the tantalum nitride film 108 of the resistor.

Next, a metal layer is deposited on the semiconductor substrate 100 in which the first via plugs 114a, 114b, 114c and 114d are formed, and is then selectively patterned to form a second metal wiring Mx+1. The second metal wiring Mx+1 can have a structure in which the aluminum film 116 and the titanium nitride film 118 are stacked.

Figure 5:
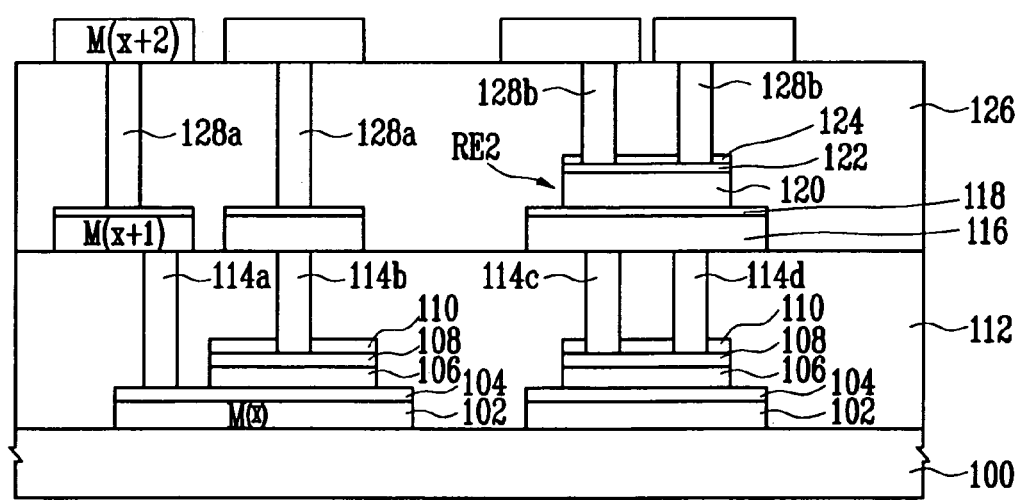

Referring to FIG. 5, a film for forming the resistor is deposited on the semiconductor substrate 100 in which the second metal wiring Mx+1 is formed. In the concrete, a silicon nitride film (Si3N4) 120 being an insulating film, a tantalum nitride film (TaN) 122 being a conductive material film, and a silicon nitride film (Si3N4) 124 being an etch-stop layer are sequentially deposited on the semiconductor substrate 100 in which the second metal wiring Mx+1 is formed.

A photolithography process and an etch process are then performed to form a second resistor pattern RE2. In the concrete, the silicon nitride film 120, the tantalum nitride film 122 and the silicon nitride film 124 are selectively patterned to form the second resistor pattern RE2.

Thereafter, a second interlayer insulating film 126 is formed on the semiconductor substrate 100 in which the second resistor pattern RE2 is formed.

A plurality of second via holes through which the second metal wiring Mx+1 are exposed are formed.

Next, after a metal material such as tungsten (W) is deposited on the semiconductor substrate 100 in which the second via holes are formed, a CMP process and etch-back process is performed to form second via plugs 128a and 128b, which bury the second via holes. The second via plug 128b is electrically connected to the tantalum nitride film 124 of the second resistor RE2.

A metal layer is then deposited on the semiconductor substrate 100 in which the second via plugs 128a and 128b are formed, and is then selectively patterned to form a third metal wiring Mx+2. The third metal wiring Mx+2 can have a structure in which an aluminum film and a titanium nitride film are stacked.

It has been described in the present embodiment that after the via plugs are formed, the metal wiring is patterned, as an example. However, if copper (Cu) is used as the material film that is used to form the via plugs and the metal wiring, the via plugs and the metal wiring can be formed at the same time by means of a damascene or dual damascene process. In other words, a region pattern in which a via hole and a metal wiring will be formed is formed within an interlayer insulating film by means of the damascene or dual damascene process. The copper film is then deposited. Next, the via plugs and the metal wiring can be formed at the same time by means of CMP.

As described above, according to the present invention, while both a thin film resistor and a capacitor are integrated, a thin film resistor is formed on a metal layer, and the two thin film resistors are serially connected, thus increasing resistance per unit area. The capacitor and the resistor are separately formed in a prior art. However, in the present invention, they are formed in a single layer at the same time. It is thus expected that a device characteristic can be improved and a process unit price can be reduced because resistance per unit area is increased.

According to the present invention, when a thin film resistor and a capacitor are formed, films for the two elements are not separately deposited. That is, after a silicon nitride film (Si3N4)/a tantalum nitride film (TaN)/a silicon nitride film (Si3N4) are deposited at the same time, a photolithography and an etch process for separating the two elements are also performed at the same time. Thereafter, a via is formed in a layer for a device characteristic. Accordingly, the present invention can integrate the capacitor and the resistor in a simpler method compared to a prior art. Furthermore, there is an effect in that resistance can be increased because resistors formed on Mx and Mx+1 are serially connected.

Furthermore, a deposition process of films for forming a capacitor and a resistor, a photolithography process and an etch process are not performed separately. Instead, the resistor and the capacitor are formed by means of a single photolithography and etch process. Accordingly, the present invention is advantageous in that it can lower a process unit price.

According to the present invention, after both a thin film resistor and a capacitor are formed at the same time and a thin film resistor is formed on a metal wiring, the two thin film resistors are serially connected. Therefore, it is possible to increase resistance per unit area in a substrate.

Furthermore, a capacitor and a resistor are separately formed in a prior art. However, according to the present invention, they are formed in a single layer at the same time. It is thus expected that a device characteristic can be improved and a process unit price can be reduced because resistance per unit area is increased.

Moreover, according to the present invention, a resistor and a capacitor are integrated using an existing film material (for example, tantalum nitride film) by means of an existing resistor and capacitor process. Thus, a danger of process development is low.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of manufacturing a semiconductor device, comprising:
   (a) simultaneously forming a capacitor and a first resistor on a semiconductor substrate, by:
      (a-1) sequentially depositing a metal film, a barrier film, a dielectric film, a conductive material film, and an etch-stop layer;
      (a-2) selectively patterning the etch-stop layer, the conductive material film and the dielectric film to form a capacitor pattern and a first resistor pattern; and
      (a-3) selectively patterning the barrier film and the metal film by a photolithography process and an etch process, thus forming a metal wiring;
   (b) forming a first interlayer insulating film on the semiconductor substrate in which the capacitor and the first resistor are formed;
   (c) forming a plurality of first via plugs that are electrically connected to the capacitor and the resistor, and a first metal wiring that is electrically connected to the first via plugs, in the first interlayer insulating film;
   (d) forming a second resistor on the first metal wiring; and
   (e) forming a second interlayer insulating film on the semiconductor substrate in which the second resistor is formed, and then forming a plurality of second via plugs that are electrically connected to the first metal wiring and the second resistor, and a second metal wiring that is electrically connected to the second via plug.

2. The method as claimed in claim 1, wherein the first and second resistors are electrically connected in a serial manner.

3. The method as claimed in claim 1, wherein the metal film is an aluminum film, the barrier film is a titanium nitride film, the dielectric film is a silicon nitride film, the conductive material film is a tantalum nitride film, and the etch-stop layer is a silicon nitride film.

4. The method as claimed in claim 1, wherein the second resistor has a structure in which an insulating film, a conductive material film and an etch-stop layer are sequentially stacked.

* * * * *